(12) United States Patent
Arrington et al.

(10) Patent No.: US 11,869,824 B2
(45) Date of Patent: Jan. 9, 2024

(54) THERMAL INTERFACE STRUCTURES FOR INTEGRATED CIRCUIT PACKAGES

(71) Applicant: Intel Corporation, Santa Clara, CA (US)

(72) Inventors: Kyle J. Arrington, Chandler, AZ (US); Aaron McCann, Chandler, AZ (US); Kelly Lofgreen, Phoenix, AZ (US); Elah Bozorg-Grayeli, Chandler, AZ (US); Aravindha Antoniswamy, Phoenix, AZ (US); Joseph B. Petrini, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 917 days.

(21) Appl. No.: 16/672,858

(22) Filed: Nov. 4, 2019

(65) Prior Publication Data
US 2021/0134698 A1 May 6, 2021

(51) Int. Cl.
*H01L 23/373* (2006.01)
*H01L 23/00* (2006.01)
*H01L 25/00* (2006.01)

(52) U.S. Cl.
CPC ...... *H01L 23/3735* (2013.01); *H01L 23/3733* (2013.01); *H01L 24/16* (2013.01); *H01L 24/32* (2013.01); *H01L 24/73* (2013.01); *H01L 25/00* (2013.01); *H01L 2224/16227* (2013.01); *H01L 2224/32225* (2013.01); *H01L 2224/32245* (2013.01); *H01L 2224/32506* (2013.01); *H01L 2224/73253* (2013.01)

(58) Field of Classification Search
CPC .................................................. H01L 23/3735
See application file for complete search history.

(56) References Cited

U.S. PATENT DOCUMENTS

2004/0264136 A1* 12/2004 Houle ................... H01L 23/373
257/E23.09

* cited by examiner

*Primary Examiner* — Yu-Hsi D Sun
(74) *Attorney, Agent, or Firm* — Essential Patents Group, LLP

(57) ABSTRACT

A thermal interface structure may be formed comprising a thermally conductive substrate having a first surface and an opposing second surface, a first liquid metal layer on the first surface of the thermally conductive substrate, and a second liquid metal layer on the second surface of the thermally conductive substrate. The thermal interface structure may be used in an integrated circuit assembly or package between at least one integrated circuit device and a heat dissipation device.

25 Claims, 7 Drawing Sheets

THERMAL INTERFACE STRUCTURES FOR INTEGRATED CIRCUIT PACKAGES

TECHNICAL FIELD

Embodiments of the present description generally relate to the removal of heat from integrated circuit devices, and, more particularly, to thermal management solutions using liquid metal layers in conjunction with thermally conductive substrates.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. This is a particular problem when multiple integrated circuit devices are incorporated into multi-device or multi-chip packages (MCPs) and/or when the integrated circuit device of the integrated circuit package has a specific area or areas that generate greater heat than other areas of the integrated circuit device during operation. These areas are known as "hot spots" and are particularly susceptible to thermal damage. Thus, heat dissipation devices are used to remove heat from the integrated circuit devices in an integrated circuit package. In one example, at least one integrated circuit device may be mounted to a substrate and the heat dissipation device, known as an integrated heat spreader, may be attached to the substrate and extend over the integrated circuit device(s) to form the integrated circuit package. The distance between the integrated circuit device(s) and the heat dissipation device is known as the bond line thickness (BLT).

Generally, a thermal interface material is disposed between the integrated circuit device(s) and the heat dissipation device to form thermal contact therebetween. The thermal efficiency of the thermal interface material is critical to effectively remove heat from the integrated circuit device(s). As will be understood, many thermal applications are limited to low and non-uniform applied loads across the thermal interface material, which can cause local thermal resistance (i.e. junction-to-case or "Rjc") to vary. This variance of thermal resistance can directly impact the performance of the integrated circuit package, if hot spots result in the heat dissipation device not being able to remove the heat effectively. Currently, solder-based thermal interface materials provide the best performance with regard to thermal resistance, junction-to-case. However, solder-based thermal interface materials, require flux, backside metallization on the integrated circuit device, and gold plating on the heat dissipation device. The gold plating is costly, and the backside metallization may require special tooling that is not always available for all sizes of integrated circuit devices, as will be understood to those skilled in the art.

Furthermore, thermal interface materials may have intrinsic material properties on exposure to thermo-mechanical stresses which can result in "failure modes". These failure modes can include voiding, which can result in delamination from the heat dissipation device and/or the integrated circuit device(s); hardening, which can lead to loss of adhesion that can also result in delamination from the heat dissipation device and/or the integrated circuit devices; and pump-out, where the thermal interface material physically moves out from between the heat dissipation device and the integrated circuit device(s). The thermo-mechanical stresses that cause failure modes result from temperature cycles during the operation of the integrated circuit package. The temperature cycles cause warpage in integrated circuit device(s) within the integrated circuit package when it heats and cools during operation. For example, in a standard integrated circuit package with one integrated circuit device, the heat dissipation device bottoms out at approximately the center of the integrated circuit device, due to the integrated circuit device's natural convex shape at room temperature. When the integrated circuit package is exposed to temperature gradients, the shape of the integrated circuit device changes from convex to flat or concave, which causes compression on the thermal interface material at edges or sidewalls of the integrated circuit device. When the integrated circuit package returns to room temperature, the integrated circuit device returns to a convex shape creating an elongation of the thermal interface material at the edge or sidewalls of the integrated circuit device. The mechanisms of compression and elongation may cause the previously discussed failure modes.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
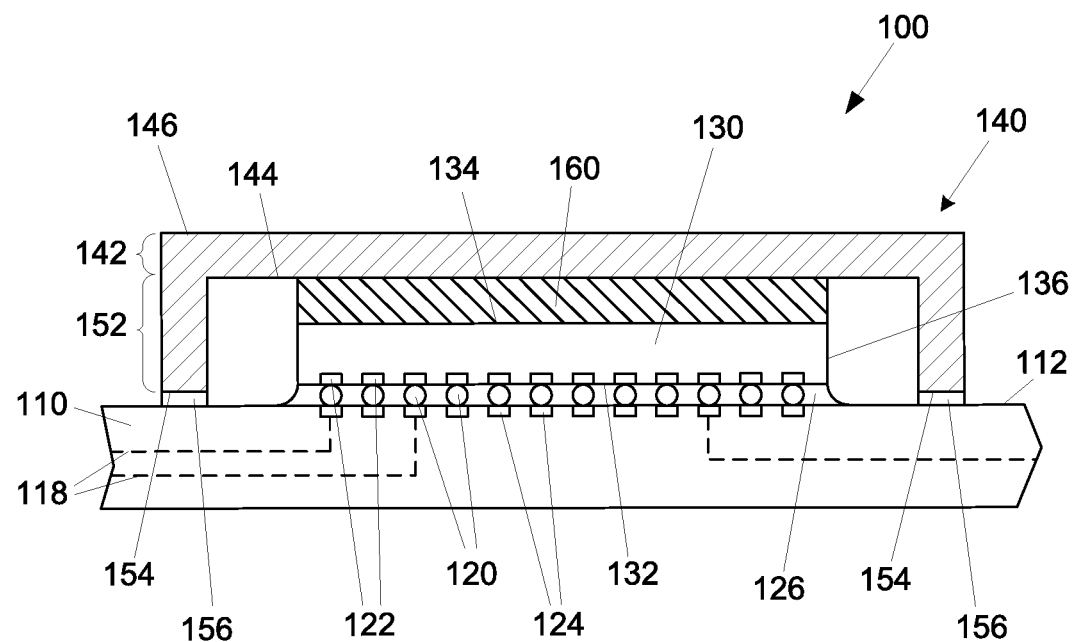
FIG. 1 is a side cross-sectional view of an integrated circuit assembly having a heat dissipation device in thermal contact with an integrated circuit device, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include a thermal interface structure that comprises a thermally conductive substrate having a first surface and an opposing second surface, a first liquid metal formed on the first surface of the thermally conductive substrate, and a second liquid metal layer formed the second surface of the thermally conductive substrate. The thermal interface structure may be used in an integrated circuit assembly between at least one integrated circuit device and a heat dissipation device.

As shown in FIG. 1, an integrated circuit assembly 100 may be formed by first providing or forming an electronic substrate 110, such as an interposer, a printed circuit board, a motherboard, or the like. At least one integrated circuit device 130 may be attached to a first surface 112 of the electronic substrate 110 with a plurality of interconnects 120. The plurality of interconnects 120 may extend between bond pads 122 formed in or on a first surface 132 (also known as the "active surface") of the integrated circuit device 130, and substantially mirror-image bond pads 124 in or on the first surface 112 of the electronic substrate 110. The at least one integrated circuit device 130 may further include a second surface 134 (also known as the "back surface") opposing the first surface 132 and at least one side 136 extending between the first surface 132 and the second surface 134 of the at least one integrated circuit device 130. The least one integrated circuit device 130 may be any appropriate device, including, but not limited to, a microprocessor, a multichip package, a chipset, a graphics device, a wireless device, a memory device, an application specific integrated circuit device, combinations thereof, stacks thereof, or the like. The interconnects 120 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys).

An underfill material 126, such as an epoxy material, may be disposed between the first surface 132 of the integrated circuit device 130 and the first surface 112 of the electronic substrate 110, and surrounding the plurality of interconnects 120. As will be understood to those skilled in the art, the underfill material 126 may be dispensed between the first surface 132 of the integrated circuit device 130 and the first surface 112 of the electronic substrate 110 as a viscous liquid and then hardened with a curing process. The underfill material 126 may also be a molded underfill material. The underfill material 126 may provide structural integrity and may prevent contamination, as will be understood to those skilled in the art.

As further shown in FIG. 1, the electronic substrate 110 may provide electrically conductive routes (illustrated as dashed lines 118) between the integrated circuit device 130 and external components (not shown). As will be understood to those skilled in the art, the bond pads 122 of the integrated circuit device 130 may be in electrical communication with integrated circuitry (not shown) within the integrated circuit device 130.

The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate.

As further shown in FIG. 1, a heat dissipation device 140 may be attached to the electronic substrate 110. The heat dissipation device 140 may include a planar structure 142 having a first surface 144 and an opposing second surface 146, and may have at least one extension 152 projecting from the first surface 144 of the planar structure 142 of the heat dissipation device 140. Such as configuration of the heat dissipation device 140 is referred to in the art as an integrated heat spreader or lid. The heat dissipation device extension(s) 152 may be attached to the first surface 112 of the electronic substrate 110 such that the first surface 144 of the planar structure 142 spans, but does not necessarily directly contact the second surface 134 (e.g. opposing the first surface 132) of the integrated circuit device 130, and a thermal interface structure 160 may be disposed between the first surface 144 of the planar structure 142 of the heat dissipation device 140 and the second surface 134 of the integrated circuit device 130. The heat dissipation device extension(s) 152 may be attached to the electronic substrate 110 by any appropriate means, including but not limited to a sealant material 156, such as an epoxy, disposed between an attachment surface 154 of the heat dissipation device extension(s) 152 and the first surface 112 of the electronic substrate 110. In one embodiment, the heat dissipation device extension(s) 152 extend substantially perpendicular to the first surface 144 of the planar structure 142 of the heat dissipation device 140. It is understood that the term substantially perpendicular includes the heat dissipation device extension(s) 152 being plus or minus 5 degrees from 90 degrees.

The heat dissipation device 140 may be formed from any appropriate thermally conductive material, including, but not limited to copper, aluminum, nickel, alloys thereof, and the like. In one embodiment, the heat dissipation device 140 may be formed from a molding or a stamping process, such that the heat dissipation device 140 is a single continuous material. In another embodiment, the planar structure 142 of the heat dissipation device 140 may be formed separately from the extension(s) 152 of heat dissipation device 140 and attached together.

Figure 2:
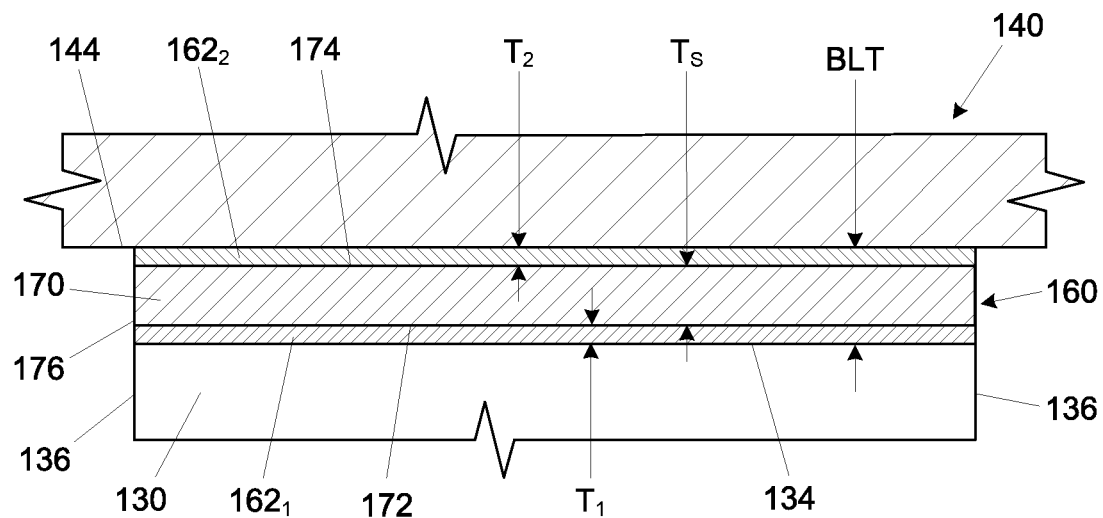
FIG. 2 is a close-up, side cross-sectional view of the integrated circuit assembly of FIG. 1 illustrating a thermal interface structure between the heat dissipation device and the integrated circuit device, according to one embodiment of the present description.

FIG. 2 illustrates the thermal interface structure 160 disposed between the first surface 144 of the planar structure 142 of the heat dissipation device 140 and the second surface 134 of the integrated circuit device 130. In one embodiment of the present description, the thermal interface structure 160 may comprise a thermally conductive substrate 170, a first liquid metal layer 162$_1$ abutting a first surface 172 of the thermally conductive substrate 170, a second liquid metal layer 162$_2$ abutting a second surface 174 of the thermally conductive substrate 170. The first liquid metal layer 162$_1$ may contact the second surface 134 of the integrated circuit device 130 and the second liquid metal layer 162$_2$ may contact the first surface 144 of the planar structure 142 of the heat dissipation device 140. The first liquid metal layer 162$_1$ and second liquid metal layer 162$_2$ may allow for improved thermal contact resistance due to the wetting properties and low contact resistance of the liquid metal. Furthermore, the embodiments of the present description allow the thermally conductive substrate 170 to "float" between the integrated circuit device 130 and the heat dissipation device 140, which may reduce stress in the integrated circuit assembly 100.

The first liquid metal layer 162$_1$ and the second liquid metal layer 162$_2$ may be any appropriate metal or metal alloy that has a low melting point, which forms a eutectic that is liquid at room temperature (e.g. about 22 to 25 degrees Celsius). In one embodiment, either the first liquid metal layer 162$_1$ and/or the second liquid metal layer 162$_2$ may comprise gallium or alloys thereof. In a specific embodiment, the liquid metal may be an alloy of gallium, indium, and tin, known as galinstan. In an embodiment, the first liquid metal layer 162$_1$ and/or the second liquid metal layer 162$_2$ may be between about 62 and 95 percent by weight gallium, between about 4 and 22 percent by weight indium, and between about 1 and 16 percent by weight tin. Liquid metals, such as the first liquid metal 162$_1$ and the second liquid metal 162$_2$, may be advantageous in the thermal interface structure 160 due to its extremely low thermal resistance, and has been used as such. However, if the thermal interface structure 160 were only a liquid metal layer, it may be susceptible to pump out (as previously discussed) and lacks control over bond line thickness BLT, as will be understood to those skilled in the art. The inclusion of the thermally conductive substrate 170 may reduce the risk of pump out for either of the first liquid metal layer 160$_1$ or the second liquid metal layer 160$_2$, since a thickness $T_1$ of the first liquid metal layer 160$_1$ and a thickness $T_2$ of the second liquid metal layer 160$_2$ is relatively small compared to the bond line thickness BLT, as will be understood to those skilled in the art. Furthermore, the thermally conductive substrate 170 may allow for bond line thickness BLT control, as the heat dissipation device 140 may bottom out on a maximum thickness $T_S$ of the thermally conductive substrate 170. In one embodiment, the first liquid metal layer 162$_1$ and the second liquid metal layer 162$_2$ may be made of the same material(s). In another embodiment, the first liquid metal layer 162$_1$ and the second liquid metal layer 162$_2$ may be differing material(s).

As the thermal interface structure 160 must be highly thermally conductive, metals and metal alloys may be contemplated as potential material for the fabrication of the thermally conductive substrate 170; however, liquid metals are generally corrosive to metals and metal alloys. For example, gallium is corrosive to all metals, except tungsten and tantalum. It is understood that the degradation process of the corrosion will decrease the thermal performance of the thermal interface structure 160 as a function of time and temperature. Thus, in one embodiment, the thermally conductive substrate 170 may be any appropriate material that is resistant to corrosion from the first liquid metal layer 162$_1$ and/or the second liquid metal layer 162$_2$. In one embodiment of the present description, the thermally conductive substrate 170 may comprise a metal material that is susceptible to little or no corrosion with regard to the first liquid metal layer 162$_1$ and/or the second liquid metal layer 162$_2$, including, but not limited to, amorphous metals and refractory metals. In an embodiment of the present description, the thermally conductive substrate 170 may be stainless steel, titanium, nickel, tungsten, and alloys thereof. In a specific embodiment of the present description, the thermally conductive substrate 170 may comprise a copper structure plated with a layer of nickel. In another embodiment of the present description, the thermally conductive substrate 170 may comprise ceramic materials, including, but not limited to, boron nitride (BN), aluminum oxide ($Al_2O_3$), silicon carbide (SiC), silicon oxide ($SiO_2$), zinc oxide (ZnO), and the like. In still another embodiment of the present description, the thermally conductive substrate 170 may comprise a gap pad. A gap pad may be a pre-formed square or rectangle of solid material, such as paraffin wax or silicone-based material, that is relatively firm at room temperature, but becomes soft at higher temperatures. In yet still another embodiment, the gap pad may comprise a vertical carbon thermal interface material comprising a polymer matrix and carbon flakes aligned in a direction of heat flow from the integrated circuit device 130 to the heat dissipation device 140.

Figure 3:
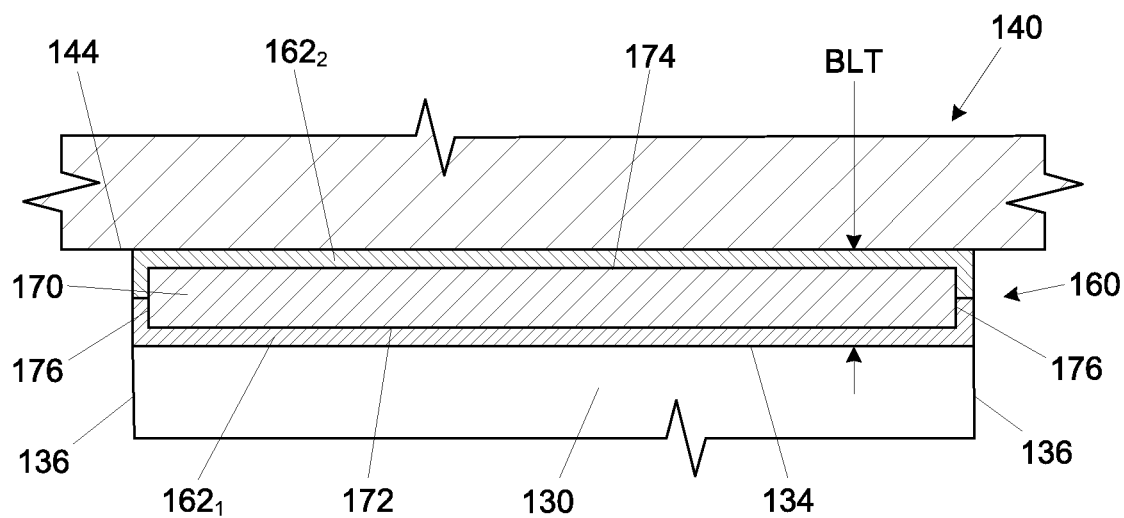
FIG. 3 is a close-up, side cross-sectional view of the integrated circuit assembly of FIG. 1 illustrating a thermal interface structure between the heat dissipation device and the integrated circuit device, according to another embodiment of the present description.

As shown in FIG. 3, a portion of at least one of the first liquid metal layer $162_1$ and the second liquid metal layer $162_2$ may extend over at least a portion of at least one side 176 of the thermally conductive substrate 170, wherein the at least one side 176 of the thermally conductive substrate 170 extends between the first surface 172 and the second surface 174 of the thermally conductive substrate 170. In one embodiment, the first liquid metal layer $162_1$ and the second liquid metal layer $162_2$ may contact one another to essentially encapsulate the thermally conductive substrate 170. When the first liquid metal layer $162_1$ and the second liquid metal layer $162_2$ are the same material and when they contact one another, the first liquid metal layer $162_1$ and the second liquid metal layer $162_2$ may simply become a single material structure. Thus, for the purposes of the present description, the first liquid metal layer $162_1$ may be a separate layer from the second liquid metal layer $162_2$, or the first liquid metal layer $162_1$ may be a portion of a liquid metal contacting the first surface 172 for the thermally conductive substrate 170 and the second liquid metal layer $162_2$ may be a portion of the liquid metal contacting the second surface 174 for the thermally conductive substrate 170.

Figure 4:
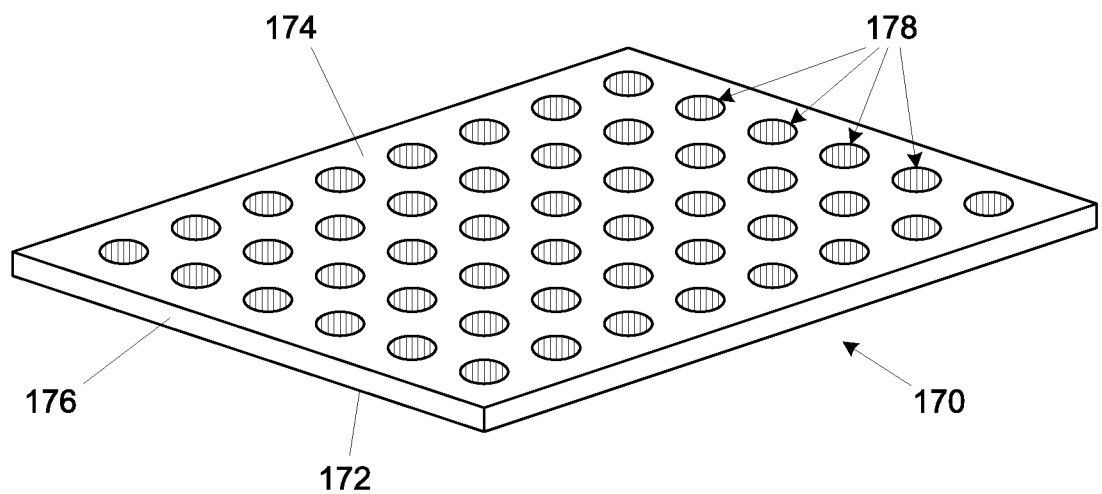
FIG. 4 is an oblique view of a thermally conductive substrate, according to an embodiment of the present description.
Figure 5:
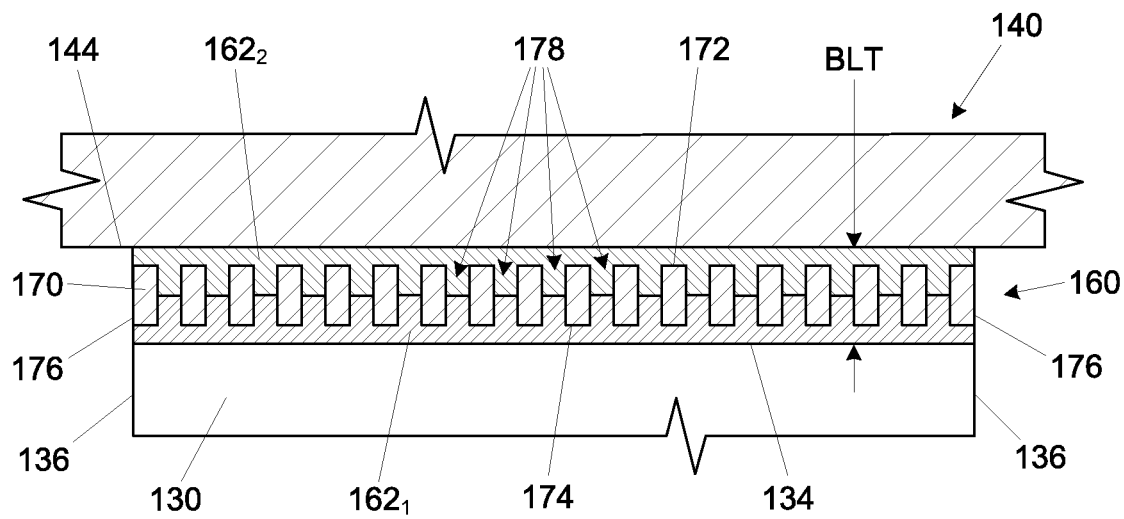
FIG. 5 is a close-up, side cross-sectional view of the integrated circuit assembly of FIG. 1 illustrating a thermal interface structure between the heat dissipation device and the integrated circuit device, according to still another embodiment of the present description.

As shown in FIGS. 4 and 5, the thermally conductive substrate 170 may comprise at least one opening 178 therethrough extending from the first surface 172 to the second surface 174 of the thermally conductive substrate 170. As shown in FIG. 5, at least a portion of the first liquid metal layer $162_1$ and/or a portion of the second liquid metal layer $162_2$ may extend into the at least one opening 178. In one embodiment, the first liquid metal layer $162_1$ and the second liquid metal layer $162_2$ may contact one another within the at least one opening 178. When the first liquid metal layer $162_1$ and the second liquid metal layer $162_2$ are the same material and when they contact one another within the at least one opening 178, the first liquid metal layer $162_1$ and the second liquid metal layer $162_2$ may simply become a single material structure.

Figure 6:
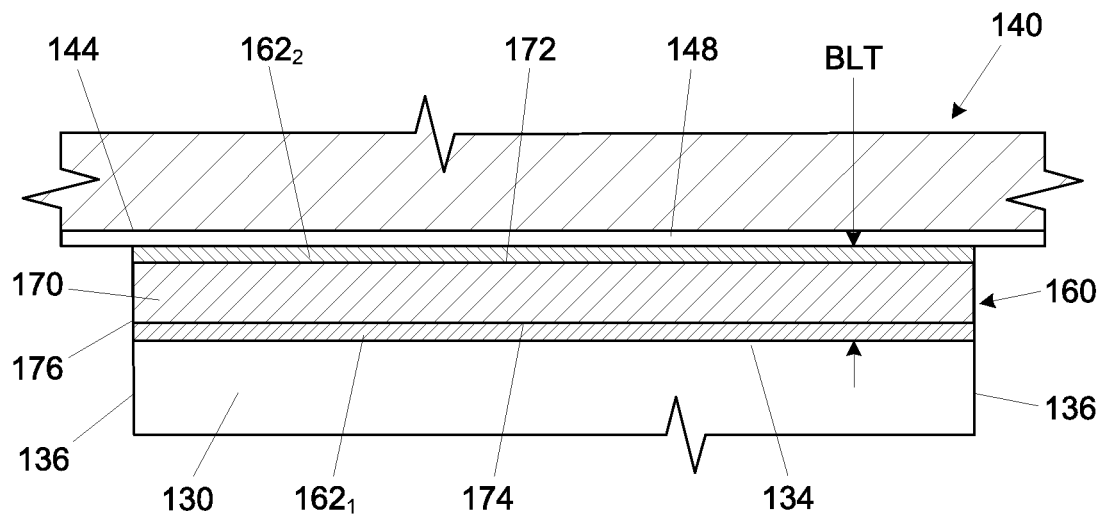
FIG. 6 is a close-up, side cross-sectional view of the integrated circuit assembly of FIG. 1 illustrating a thermal interface structure between the heat dissipation device and the integrated circuit device, according to yet still another embodiment of the present description.

As shown in FIG. 6, the integrated circuit assembly 100 may further include a corrosion barrier layer 148, such as nickel, formed on the first surface 144 of the planar structure 142 of the heat dissipation device 140. As will be understood, the corrosion barrier layer 148 is positioned to prevent corrosion of the heat dissipation device 140 by the second liquid metal layer $162_2$ of the thermal interface structure 160. Ordinarily, the materials of the integrated circuit device 130 will not be susceptible to corrosion from the first liquid metal layer $162_1$ of the thermal interface structure 160. However, if it is, then a second corrosion barrier layer (not shown) may be placed between the thermal interface structure 160 and the integrated circuit device 130.

Figure 7:
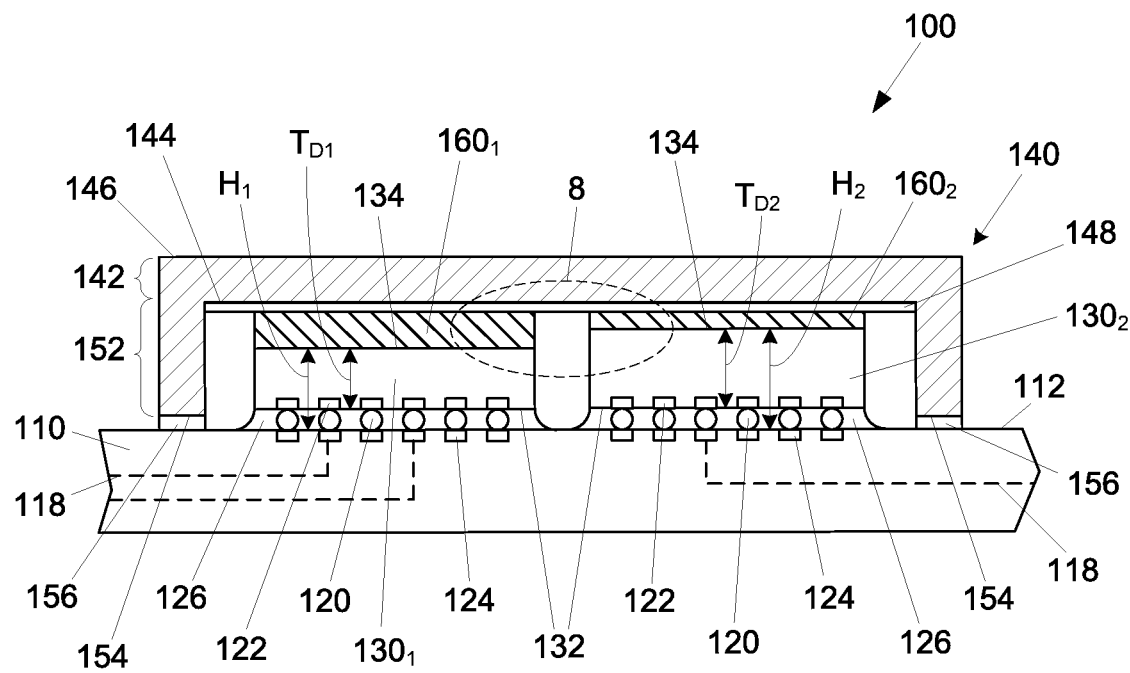
FIG. 7 is a side cross-sectional view of an integrated circuit assembly having the heat dissipation device of FIG. 1 in thermal contact with a plurality of integrated circuit devices, according to another embodiment of the present description.

Although the embodiments of FIGS. 1-6 illustrate a single integrated circuit device 130, the embodiments of the present description are not so limited. In a further embodiment, as illustrated in FIG. 7, a plurality of integrated circuit devices (e.g. a first integrated circuit device $130_1$ and a second integrated circuit device $130_2$) may be thermally attached to the heat dissipation device 140 with a first thermal interface structure $160_1$ between the first integrated circuit device $130_1$ and the heat dissipation device 140, and with the second thermal interface structure $160_2$ between the second integrated circuit device $130_2$ and the heat dissipation device 140. In one embodiment, the first thermal interface structure $160_1$ and the second thermal interface structure $160_2$ may be made of the same materials. In another embodiment, the first thermal interface structure $160_1$ and the second thermal interface structure $160_2$ may be differing materials for the first liquid metal layers $162_1$, the second liquid metal layers $162_2$, and/or the thermally conductive substrates 170, respectively.

Figure 8:
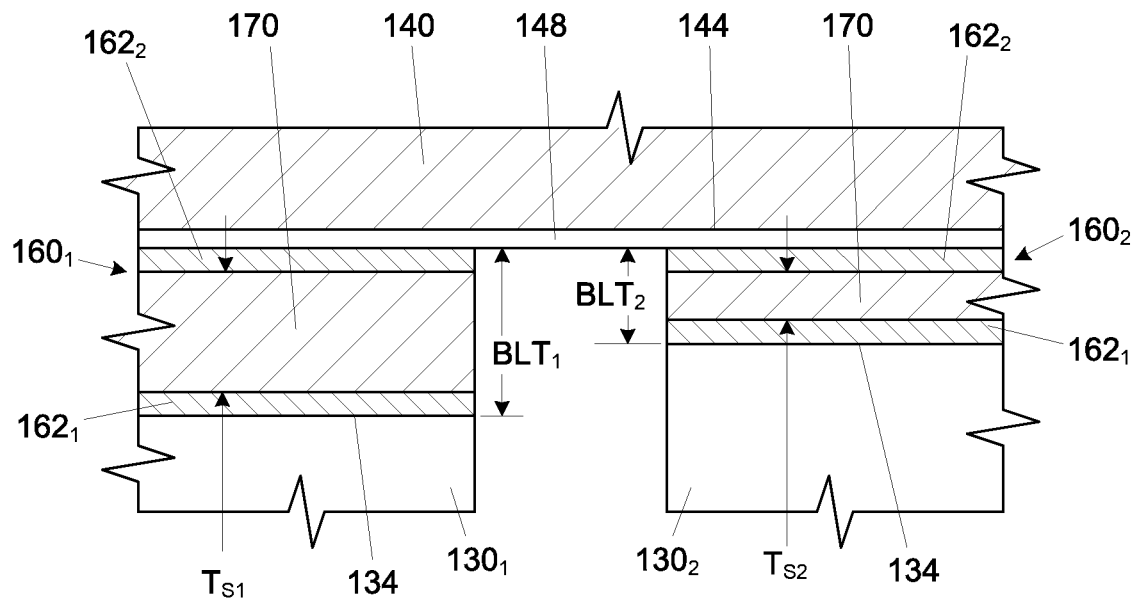
FIG. 8 is a side cross-sectional view of inset 8 of the integrated circuit assembly of FIG. 7, according to one embodiment of the present description.

As will be understood, the plurality of integrated circuit devices may have different thicknesses. For example, as shown in FIGS. 7 and 8, the first integrated circuit device $130_1$ and the second integrated circuit device $130_2$ may have differing thicknesses $T_{D1}$ and $T_{D2}$ (see FIG. 7), respectively, that is measured from the first surface 132 to the second surface 134 of the first integrated circuit device $130_1$ and the second integrated circuit device $130_2$, respectively. The differing thicknesses $T_{D1}$ and $T_{D2}$ may result in differing heights $H_1$ and $H_2$ between the first integrated circuit device $130_1$ and the second integrated circuit device $130_2$, respectively, that is measured from the first surface 112 of the electronic substrate 110 to the second surface 134 of each of the first integrated circuit device $130_1$ and the second integrated circuit device $130_2$, respectively, which may result in differing bond line thicknesses $BLT_1$ and $BLT_2$ (see FIG. 8), respectively. Thus, as illustrated in FIG. 8, the thermally conductive substrate $170_1$ of the first thermal interface structure $160_1$ may have a larger thickness $T_{S1}$ than a thickness $T_{S2}$ of the thermally conductive substrate $170_2$ of the second thermal interface structure $160_2$ to compensate for the difference between the height $H_1$ of the first integrated circuit device $130_1$ and the height $H_2$ of the second integrated circuit device $130_2$.

Figure 9:
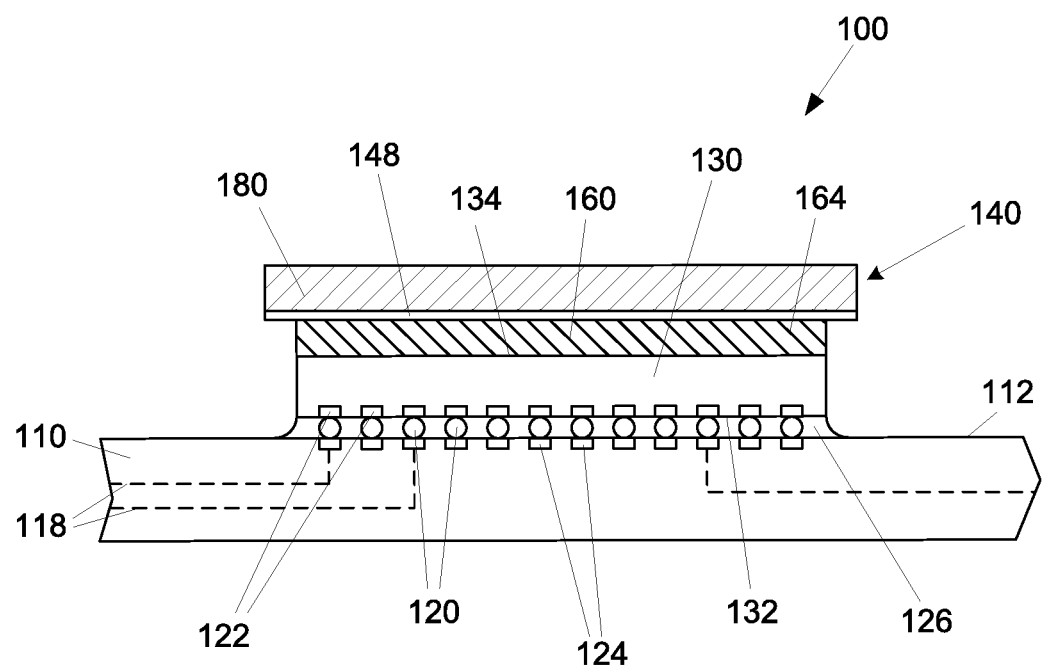
FIG. 9 is a side cross-sectional view of an integrated circuit assembly having a heat dissipation device in thermal contact with an integrated circuit device, according to another embodiment of the present description.
Figure 10:
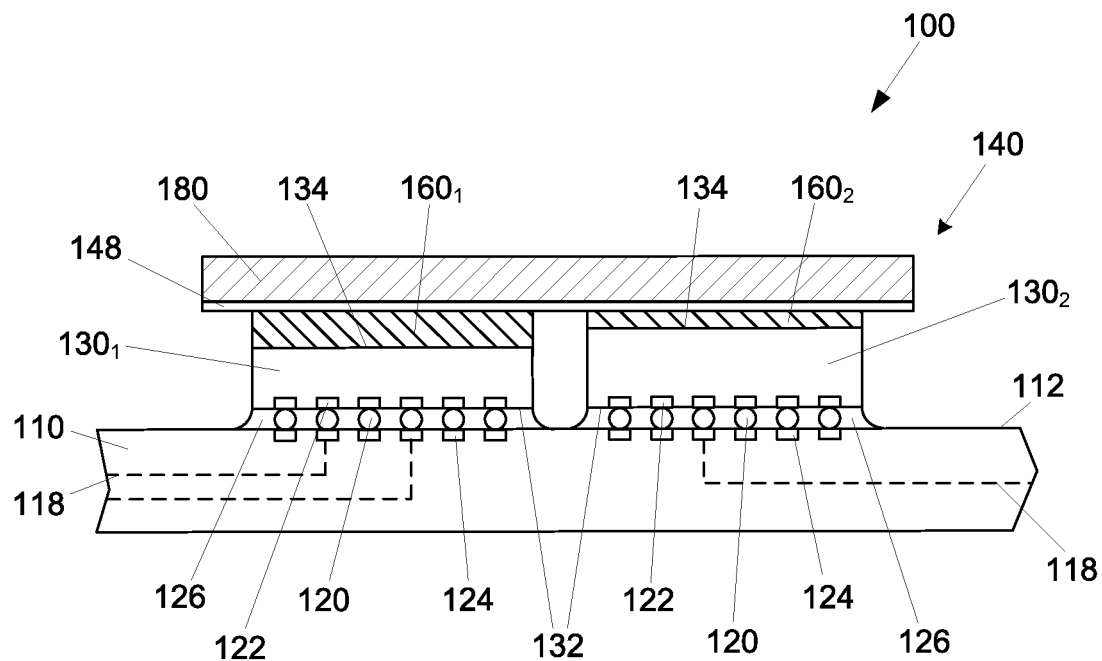
FIG. 10 is a side cross-sectional view of an integrated circuit assembly having the heat dissipation device of FIG. 9 in thermal contact with a plurality of integrated circuit devices, according to an embodiment of the present description.

Although the embodiments of FIGS. 1-8 are illustrated with a heat dissipation device 140 as an integrated heat spreader or lid, as previously discussed, the embodiments of the present description are not so limited. As shown in FIG. 9, the heat dissipation device 140 may comprise a heat sink or plate 180. As shown in FIG. 10, the heat sink or plate 180 may be used in the integrated circuit assembly 100 having a plurality of integrated circuit devices (such as shown in FIG. 7).

It is understood that one or more additional heat dissipation devices (not shown), including but not limited to heat pipes, high surface area dissipation structures with a fan (such as a structure having fins or pillars/columns formed in a thermally conductive structure), liquid cooling devices, and the like, may be thermally connected to the heat dissipation device 140 to remove heat therefrom in any of the embodiments of the present description.

Figure 11:
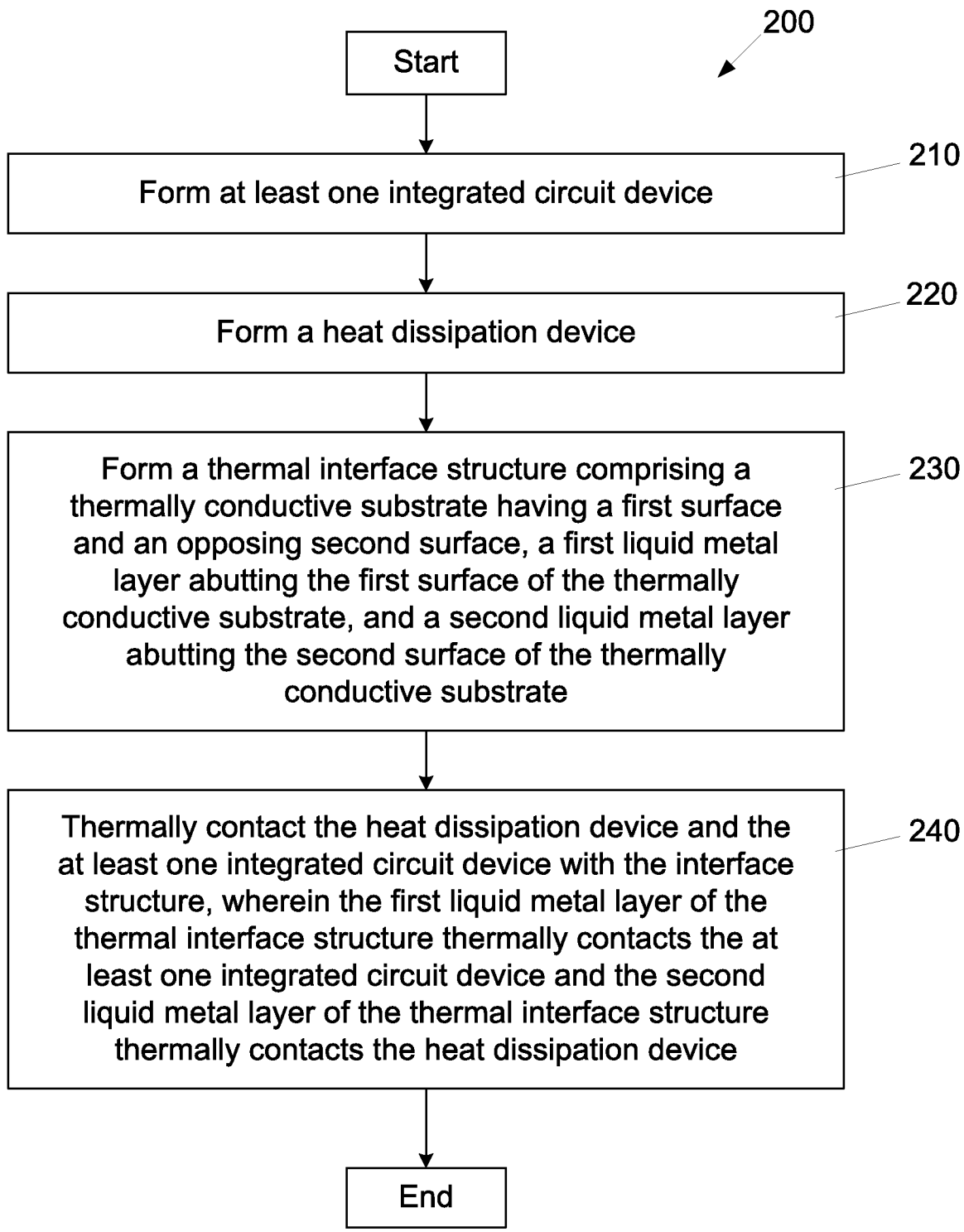
FIG. 11 is a flow diagram of a method for fabricating an integrated circuit assembly, according to an embodiment of the present description.

FIG. 11 is a flow chart of a process 200 for fabricating an integrated circuit assembly according to an embodiment of the present description. As set forth in block 210, at least one integrated circuit device may be formed. A heat dissipation device may be formed, as set forth in block 220. As set forth in block 230, a thermal interface structure may be formed comprising a thermally conductive substrate having a first surface and an opposing second surface, a first liquid metal layer abutting the first surface of the thermally conductive substrate, and a second liquid metal layer abutting the second surface of the thermally conductive substrate. The heat dissipation device may be brought into thermal contact the at least one integrated circuit device with the thermal interface structure, wherein the first liquid metal layer of the thermal interface structure thermally contacts the at least one integrated circuit device and the second liquid metal layer of the thermal interface structure thermally contacts the heat dissipation device, as set forth in block 240.

Figure 12:
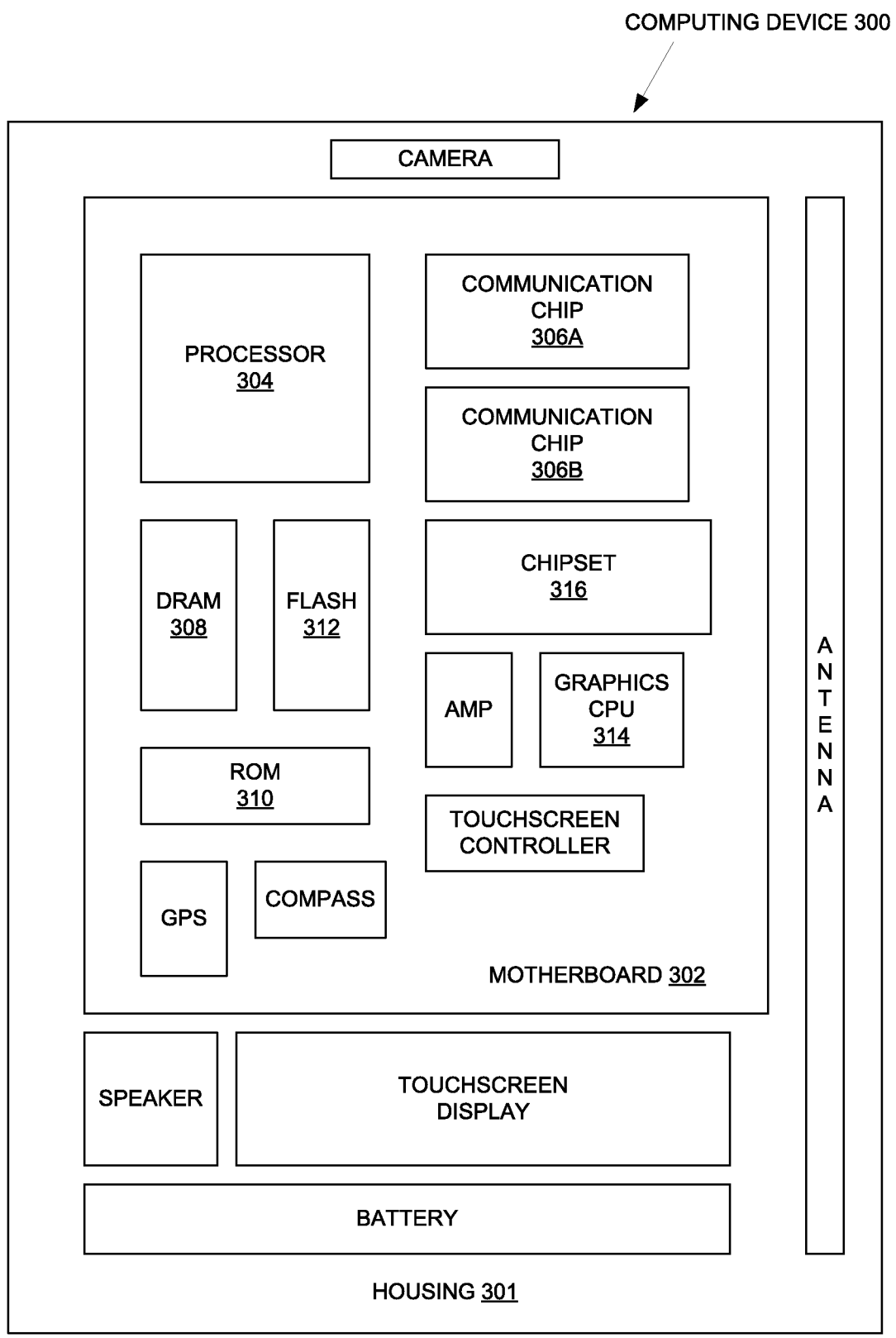
FIG. 12 is an electronic device/system, according to an embodiment of the present description.

FIG. 12 illustrates an electronic system or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip or device may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include at least one integrated circuit device, a heat dissipation device thermally contacting the at least one integrated circuit device, and a thermal interface structure between the at least one integrated circuit device and the heat dissipation device, wherein the thermal interface structure comprises a thermally conductive substrate having a first surface and an opposing second surface, a first liquid metal layer between the at least one integrated circuit device and the first surface of the thermally conductive substrate, and a second liquid metal layer between the heat dissipation device and the second surface of the thermally conductive substrate.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-12. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit assembly, comprising at least one integrated circuit device; a heat dissipation device thermally contacting the at least one integrated circuit device; and a thermal interface structure between the at least one integrated circuit device and the heat dissipation device, wherein the thermal interface structure comprises a thermally conductive substrate having a first surface and an opposing second surface, a first liquid metal layer between the at least one integrated circuit device and the first surface of the thermally conductive substrate, and a second liquid metal layer between the heat dissipation device and the second surface of the thermally conductive substrate.

In Example 2, the subject matter of Example 1 can optionally include at least one of the first liquid metal layer and the second liquid metal layer comprising an alloy of gallium, indium, and tin.

In Example 3, the subject matter of any of Examples 1 and 2 can optionally include the thermally conductive substrate being selected from the group consisting of a metal substrate, a ceramic substrate, and a gap pad.

In Example 4, the subject matter of Example 3 can optionally include the metal substrate comprising an amorphous metal.

In Example 5, the subject matter of Example 3 can optionally include the metal substrate comprising a refractory metal.

In Example 6, the subject matter of any of Examples 1 to 5 can optionally include the thermally conductive substrate including at least one opening extending from the first surface of the thermally conductive substrate to the second surface of the thermally conductive substrate, and wherein at least a portion of at least one of the first liquid metal layer and the second liquid metal layer extends into the at least one opening.

In Example 7, the subject matter of any of Examples 1 to 6 can optionally include a corrosion resist layer formed between the heat dissipation device and the thermal interface structure.

In Example 8, the subject matter of any of Examples 1 to 7 can optionally include an electronic substrate, wherein the at least one integrated circuit device is electrically attached to the electronic substrate.

In Example 9, the subject matter of Example 8 can optionally include the heat dissipation device being attached to the electronic substrate.

Example 10 is an electronic system, comprising a board and an integrated circuit assembly electrically attached to the board, wherein the integrated circuit assembly comprises an integrated circuit assembly, comprising at least one integrated circuit device, a heat dissipation device thermally contacting the at least one integrated circuit device, and a thermal interface structure between the at least one integrated circuit device and the heat dissipation device, wherein the thermal interface structure comprises a thermally conductive substrate having a first surface and an opposing second surface, a first liquid metal layer between the at least one integrated circuit device and the first surface of the thermally conductive substrate, and a second liquid metal layer between the heat dissipation device and the second surface of the thermally conductive substrate.

In Example 11, the subject matter of Example 10 can optionally include at least one of the first liquid metal layer and the second liquid metal layer comprising an alloy of gallium, indium, and tin.

In Example 12, the subject matter of any of Examples 10 and 11 can optionally include the thermally conductive substrate being selected from the group consisting of a metal substrate, a ceramic substrate, and a gap pad.

In Example 13, the subject matter of Example 12 can optionally include the metal substrate comprising an amorphous metal.

In Example 14, the subject matter of Example 12 can optionally include the metal substrate comprising a refractory metal.

In Example 15, the subject matter of any of Examples 10 to 14 can optionally include the thermally conductive substrate including at least one opening extending from the first surface of the thermally conductive substrate to the second surface of the thermally conductive substrate, and wherein at least a portion of at least one of the first liquid metal layer and the second liquid metal layer extends into the at least one opening.

In Example 16, the subject matter of any of Examples 10 to 15 can optionally include a corrosion resist layer formed between the heat dissipation device and the thermal interface structure.

In Example 17, the subject matter of any of Examples 10 to 16 can optionally include an electronic substrate, wherein the at least one integrated circuit device is electrically attached to the electronic substrate.

In Example 18, the subject matter of Example 17 can optionally include the heat dissipation device being attached to the electronic substrate.

Example 19 is a method of fabricating an integrated circuit assembly comprising forming at least one integrated circuit device, forming a heat dissipation device, forming a thermal interface structure comprising a thermally conductive substrate having a first surface and an opposing second surface, a first liquid metal layer abutting the first surface of the thermally conductive substrate, and a second liquid metal layer abutting the second surface of the thermally conductive substrate; and thermally contacting the heat dissipation device and the at least one integrated circuit device with the thermal interface structure, wherein the first liquid metal layer of the thermal interface structure contacts the at least one integrated circuit device and the second liquid metal layer of the thermal interface structure contacts the heat dissipation device.

In Example 20, the subject matter of Example 19 can optionally include at least one of the first liquid metal layer and the second liquid metal layer comprising an alloy of gallium, indium, and tin.

In Example 21, the subject matter of any of Examples 19 and 20 can optionally include selecting the thermally conductive substrate from the group consisting of a metal substrate, a ceramic substrate, and a gap pad.

In Example 22, the subject matter of Example 21 can optionally include the metal substrate comprising an amorphous metal.

In Example 23, the subject matter of Example 21 can optionally include the metal substrate comprising a refractory metal.

In Example 24, the subject matter of any of Examples 19 to 23 can optionally include forming the thermally conductive substrate including forming at least one opening extending from the first surface of the thermally conductive substrate to the second surface of the thermally conductive substrate, and wherein at least a portion of at least one of the first liquid metal layer and the second liquid metal layer extends into the at least one opening.

In Example 25, the subject matter of any of Examples 19 to 24 can optionally include forming a corrosion resist layer between the heat dissipation device and the thermal interface structure.

In Example 26, the subject matter of any of Examples 19 to 25 can optionally include forming an electronic substrate and electrically attaching the at least one integrated circuit device to the electronic substrate.

In Example 27, the subject matter of Example 26 can optionally include attaching the heat dissipation device to the electronic substrate.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
    at least one integrated circuit device;
    a heat dissipation device; and
    a thermal interface structure thermally connecting the at least one integrated circuit device and the heat dissipation device, wherein the thermal interface structure comprises a thermally conductive substrate having a first surface and an opposing second surface, a first liquid metal layer between the at least one integrated circuit device and the first surface of the thermally conductive substrate, and a second liquid metal layer between the heat dissipation device and the second surface of the thermally conductive substrate, wherein the thermally conductive substrate comprises at least one opening extending from the first surface of the thermally conductive substrate to the second surface of the thermally conductive substrate, and wherein at least a portion of at least one of the first liquid metal layer and the second liquid metal layer extends into the at least one opening.

2. The apparatus of claim 1, wherein at least one of the first liquid metal layer and the second liquid metal layer comprises an alloy of gallium, indium, and tin.

3. The apparatus of claim 1, wherein the thermally conductive substrate is selected from the group consisting of a metal substrate, a ceramic substrate, and a gap pad.

4. The apparatus of claim 1, wherein the thermally conductive substrate comprises an amorphous metal substrate.

5. The apparatus of claim 1, wherein the thermally conductive substrate comprises a refractory metal substrate.

6. The apparatus of claim 1, further comprising a corrosion barrier layer between the heat dissipation device and the thermal interface structure.

7. The apparatus of claim 1, further comprising an electronic substrate, wherein the at least one integrated circuit device is electrically attached to the electronic substrate.

8. The apparatus of claim 7, wherein the heat dissipation device is attached to the electronic substrate.

9. The apparatus of claim 1, further comprising:
a board; and
an integrated circuit assembly electrically attached to the board, wherein the integrated circuit assembly comprises the integrated circuit device, the heat dissipation device, and the thermal interface structure.

10. An apparatus, comprising:
an integrated circuit device;
a heat dissipation device; and
a thermal interface structure thermally coupling the integrated circuit device and the heat dissipation device, wherein the thermal interface structure comprises a substrate having a first surface and an opposing second surface, a first liquid metal layer between the integrated circuit device and the first surface, and a second liquid metal layer between the heat dissipation device and the second surface, wherein the substrate comprises an opening extending from the first surface to the second surface, and wherein at least a portion of at least one of the first liquid metal layer and the second liquid metal layer extends into the opening.

11. The apparatus of claim 10, wherein at least one of the first liquid metal layer and the second liquid metal layer comprises an alloy of gallium, indium, and tin.

12. The apparatus of claim 10, wherein the substrate is selected from the group consisting of a metal substrate, a ceramic substrate, and a gap pad.

13. The apparatus of claim 10, wherein the substrate comprises an amorphous metal substrate.

14. The apparatus of claim 10, wherein the substrate comprises a refractory metal substrate.

15. The apparatus of claim 10, further comprising a corrosion barrier layer between the heat dissipation device and the thermal interface structure.

16. The apparatus of claim 10, further comprising an electronic substrate, wherein the integrated circuit device is electrically attached to the electronic substrate.

17. The apparatus of claim 10, further comprising:
a board; and
an integrated circuit assembly electrically attached to the board, wherein the integrated circuit assembly comprises the integrated circuit device, the heat dissipation device, and the thermal interface structure.

18. An apparatus, comprising:
an integrated circuit device;
a heat dissipation device; and
a thermal interface structure thermally coupling the integrated circuit device and the heat dissipation device, wherein the thermal interface structure comprises a substrate having a first surface and an opposing second surface, a first liquid metal layer between the integrated circuit device and the first surface, and a second liquid metal layer between the heat dissipation device and the second surface, wherein the first liquid metal layer and the second liquid metal layer are liquid at a temperature of 25 degrees Celsius, and wherein the substrate comprises an opening extending from the first surface to the second surface, and wherein at least a portion of at least one of the first liquid metal layer and the second liquid metal layer extends into the opening.

19. The apparatus of claim 18, wherein at least one of the first liquid metal layer and the second liquid metal layer comprises an alloy of gallium, indium, and tin.

20. The apparatus of claim 18, wherein the substrate is selected from the group consisting of a metal substrate, a ceramic substrate, and a gap pad.

21. The apparatus of claim 18, wherein the substrate comprises an amorphous metal substrate.

22. The apparatus of claim 18, wherein the substrate comprises a refractory metal substrate.

23. The apparatus of claim 18, further comprising a corrosion barrier layer between the heat dissipation device and the thermal interface structure.

24. The apparatus of claim 18, further comprising an electronic substrate, wherein the integrated circuit device is electrically attached to the electronic substrate.

25. The apparatus of claim 18, further comprising:
a board; and
an integrated circuit assembly electrically attached to the board, wherein the integrated circuit assembly comprises the integrated circuit device, the heat dissipation device, and the thermal interface structure.

* * * * *